(12) United States Patent
Roberts et al.

(10) Patent No.: US 10,496,561 B2
(45) Date of Patent: Dec. 3, 2019

(54) RESILIENT VERTICAL STACKED CHIP NETWORK FOR ROUTING MEMORY REQUESTS TO A PLURALITY OF MEMORY DIES

(71) Applicant: Advanced Micro Devices, Inc., Sunnyvale, CA (US)

(72) Inventors: David A. Roberts, Wellesley, MA (US); Sudhanva Gurumurthi, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 234 days.

(21) Appl. No.: 15/490,036

(22) Filed: Apr. 18, 2017

(65) Prior Publication Data

US 2018/0300265 A1    Oct. 18, 2018

(51) Int. Cl.
  *G06F 13/16*   (2006.01)
  *G06F 13/40*   (2006.01)
  *G11C 5/02*    (2006.01)
  *G11C 5/06*    (2006.01)

(52) U.S. Cl.
  CPC ........ *G06F 13/161* (2013.01); *G06F 13/4022* (2013.01); *G06F 13/4068* (2013.01); *G11C 5/02* (2013.01); *G11C 5/06* (2013.01)

(58) Field of Classification Search
  CPC combination set(s) only.
  See application file for complete search history.

(56) References Cited

U.S. PATENT DOCUMENTS

| | | | |
|---|---|---|---|
| 8,130,754 B2* | 3/2012 | Binkert | G06F 15/7825 370/386 |
| 9,240,220 B2* | 1/2016 | Vorbach | G11C 5/02 |
| 9,825,843 B2* | 11/2017 | Thottethodi | G06F 17/5068 |

OTHER PUBLICATIONS

J. Thomas Pawlowski, "Hybrid Memory Cube (HMC)", Micron Technologies, Aug. 4, 2011, 24 pages.*

* cited by examiner

*Primary Examiner* — Tammara R Peyton
(74) *Attorney, Agent, or Firm* — Meyertons Hood Kivlin Kowert and Goetzel PC; Rory D. Rankin

(57) ABSTRACT

Systems, apparatuses, and methods for routing traffic through vertically stacked memory are disclosed. A computing system includes a host processor die and multiple vertically stacked memory dies. The host processor die generates memory access requests for the data stored in the multiple memory array banks in the memory dies. At least one memory die uses an on-die network switch with a programmable routing table for routing packets corresponding to the generated memory requests. Routes use both vertical hops and horizontal hops to reach the target memory array bank and to avoid any congested or failed resources along the route. The vertically stacked memory dies use through silicon via interconnects and at least one via does not traverse through all of the memory dies. Accordingly, the host processor die does not have a direct connection to one or more of the multiple memory dies.

20 Claims, 5 Drawing Sheets

RESILIENT VERTICAL STACKED CHIP NETWORK FOR ROUTING MEMORY REQUESTS TO A PLURALITY OF MEMORY DIES

BACKGROUND

Description of the Related Art

Memory bandwidth has been increasing over recent history as a result of various technological and process innovations. In one example, vertically stacked memory dies provide relatively high memory storage capacity for a same form factor. Progress has been made in three-dimensional integrated circuits (3D ICs) that include two or more layers of active electronic components integrated both vertically and horizontally into a single circuit. Components within these layers communicate using on-chip signaling, whether vertically or horizontally. In various embodiments, through silicon vias (TSVs) and groups of TSVs forming through silicon buses are used as interconnects between a base processor die and each of the memory dies stacked above the host processor die. Each of the multiple memory dies in the vertical stack includes multiple memory array banks to be used both as caches in a hierarchical cache memory subsystem and as system memory.

Although innovations provide improvements, design issues still arise with modern techniques in processing and integrated circuit design that limit potential benefits. One issue is efficient routing of requests and responses between the host processor and memory. When the number of memory array banks per memory die increases and/or the number of vertically stacked memory dies increases, the amount of sharing of the interconnect buses and logic also increases. The latency increases as well as the ability to hide the latency of busy memory array banks versus idle memory array banks becomes more difficult. Another issue is when memory array banks are used as a cache, additional traffic occurs from evictions and fills due to cache misses. Latencies continue to grow.

Additionally, when more memory dies are added to the vertical stack, the through silicon interconnect extends through each of the previous memory dies and the added memory dies. The combination of through silicon vias (TSVs) and their corresponding keep out zones consume an appreciable amount of on-die area, which limit the amount of area to use for active devices and signal routes. Further, as more memory dies are added to the vertical stack, the size of the network increases and the chance of link failures also increases. Still further, when an interconnection network is used in place of direct path bus wires, the network logic is within the host processor and routing decisions may be less efficient as traffic is routed end-to-end in a static manner.

In view of the above, efficient methods and systems for routing traffic through vertically stacked memory dies are desired.

BRIEF DESCRIPTION OF THE DRAWINGS

The advantages of the methods and mechanisms described herein may be better understood by referring to the following description in conjunction with the accompanying drawings, in which.

Figure 1:
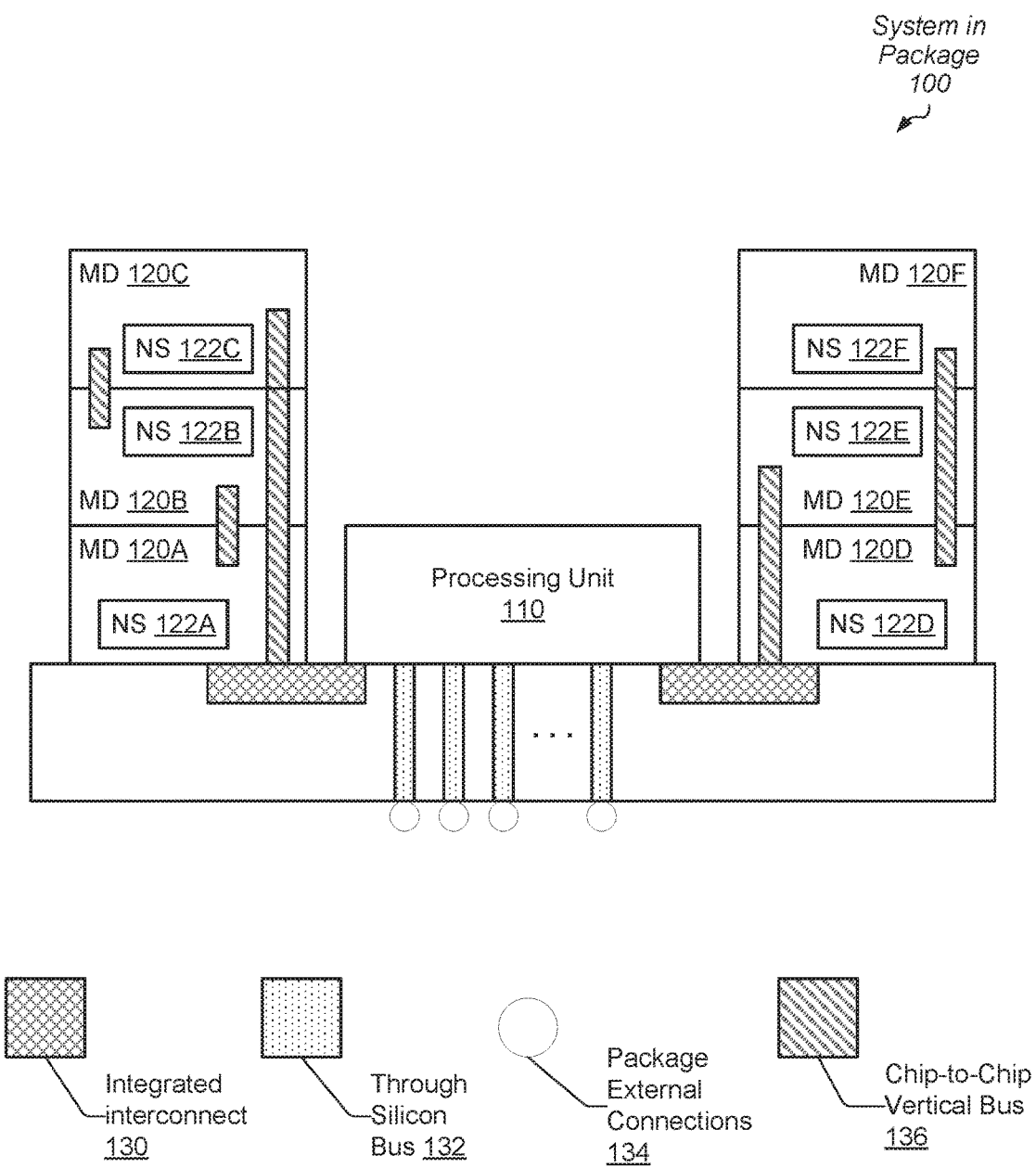
FIG. 1 is a block diagram of one embodiment of a system-in-package.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for routing traffic through vertically stacked memory dies are disclosed. In one embodiment, a computing system includes a host processor die and multiple vertically stacked memory dies. Each of the memory dies uses multiple memory array banks for storing data. The host processor die generates memory access requests for the data stored in the multiple memory array banks. In various embodiments, at least one memory die uses an on-die network switch for routing packets corresponding to the generated memory requests. The network switch uses a programmable routing table for determining a particular memory array bank of the multiple memory array banks is a target memory array bank for a received memory request. The determination is based on a target address of the memory request.

The programmable routing table provides a particular route through the multiple memory dies to the target memory array bank. In an embodiment, the programmable routing table is indexed with the target address of the memory request, and an output port of the network switch is selected for routing the packet corresponding to the memory request based on a particular address range including the target address. As the memory dies are stacked vertically as in three dimensional (3D) integrated circuits (ICs), in some embodiments, the particular route from the host processor die to the target memory array bank uses vertical hops as well as horizontal hops. In various embodiments, the vertically stacked memory dies use through silicon via interconnects and at least one through silicon via does not traverse through each of the multiple memory dies. Therefore, in some embodiments, the host processor die does not have a direct connection to one or more of the multiple memory dies. Rather, the routing of memory request traffic using packets relies on one or more network switches on one or more of the memory dies and the interconnections located between the memory dies.

In an embodiment, when a second memory die receives the packet corresponding to the memory request after the packet left the first memory die, a second network switch in the second memory die determines a second, different route to the target memory array bank. In some embodiments, the second route is determined based on one or more of a congested link, a failed link, a failed memory array bank and a failed through silicon via. In an embodiment, the different route includes one or more upward vertical hops and at least one subsequent downward vertical hop to avoid a congested or failed resource in the available routes.

Turning now to FIG. 1, a generalized block diagram of one embodiment of a system-in-package (SiP) 100 is shown. In various embodiments, three-dimensional (3D) packaging is used within a computing system. This type of packaging is referred to as a System in Package (SiP). A SiP includes one or more three-dimensional integrated circuits (3D ICs). A 3D IC includes two or more layers of active electronic components integrated both vertically and/or horizontally into a single circuit. In one embodiment, interposer-based integration is used whereby the 3D IC is placed next to the processing unit 110. Alternatively, a 3D IC is stacked directly on top of another IC.

Die-stacking technology is a fabrication process that enables the physical stacking of multiple separate pieces of silicon (integrated chips) together in a same package with high-bandwidth and low-latency interconnects. In some embodiments, the die is stacked side by side on a silicon interposer, or vertically directly on top of each other. One configuration for the SiP is to stack one or more memory chips next to and/or on top of a processing unit. By stacking memory chips, a very large cache and/or system memory is realized for the processing unit.

As shown, in one embodiment, the SiP 100 includes a processing unit 110 and multiple three-dimensional (3D) memory dies (MDs) 120A-120F. Although six memory dies are shown, any number of memory dies is used in other embodiments. In various embodiments, each of the memory dies 120A-120F uses multiple memory array banks (not shown) for storing data. In some embodiments, one or more of the memory dies 120A-120F additionally uses an on-die network switch (NS).

In the illustrated embodiment, each of the memory dies 120A-120F uses a respective one of the on-die network switches 122A-122F. In various embodiments, the SiP 100 uses a network on a chip (NoC) communication subsystem. Memory requests generated by the processing unit 110 and responses provided by the memory array banks within the memory dies 120A-120F are transferred in packets. Each packet uses an identifier for the source, an identifier for the destination, one or more control signals and a data payload. To support the NoC communication, the processing unit 110 uses interfaces with the vertically stacked memory dies 120A-120F and off-chip peripheral devices and functional units (not shown) which support both synchronous and asynchronous clock domains.

The processing unit 110 generates memory access requests for the data stored in the multiple memory array banks within the memory dies 120A-120F. Each of the on-die network switches 122A-122F uses a programmable routing table for determining if a particular memory array bank of the multiple memory array banks is a target memory array bank for a received memory request. The determination is based on a target address of the memory request.

Each of the memory dies 120A and 120D communicates with the processing unit 110 through horizontal low-latency interconnect 130. In various embodiments, the processing unit 110 is a general-purpose central processing unit; a graphics processing unit (GPU), an accelerated processing unit (APU), a field programmable gate array (FPGA), or other data processing device.

The in-package horizontal low-latency interconnect 130 provides reduced lengths of interconnect signals versus long off-chip interconnects when a SiP is not used. The in-package horizontal low-latency interconnect 130 uses particular signals and protocols as if the chips, such as the processing unit 110 and the memory dies 120A-120F, were mounted in separate packages on a circuit board. In some embodiments, the SiP 100 additionally includes backside vias or through-bulk silicon vias 132 that reach to package external connections 134. The package external connections 134 are used for input/output (I/O) signals and power signals.

In various embodiments, multiple device layers are stacked on top of one another with direct vertical interconnects 136 tunneling through them. In various embodiments, the vertical interconnects 136 are multiple through silicon vias grouped together to form through silicon buses (TSBs). The TSBs are used as a vertical electrical connection traversing through a silicon wafer. The TSBs are an alternative interconnect to wire-bond and flip chips. The size and density of the vertical interconnects 136 that can tunnel between the different device layers varies based on the underlying technology used to fabricate the 3D ICs.

A corresponding keep out zone for an individual TSV defines an area around the TSV providing a predicted stress caused by the placement of the TSV to an active device to be above a threshold. Areas outside of the keep out zone provide a predicted stress caused by the placement of the TSV to an active device to be below the threshold. For memory arrays in 3D ICs, in various embodiments, the TSVs and the corresponding keep out zones consume an appreciable amount of on-die area, as wide channels are opened between rectangular memory macro blocks for placement of the TSVs and the corresponding keep out zones. Therefore, in some embodiments, the placement of the TSBs used for implementing the vertical interconnects 136 varies as shown due to floorplanning of the memory dies 120A-120F.

As shown, some of the vertical interconnects 136 do not traverse through each of the multiple memory dies 120A-120C and 120D-120F. Therefore, in some embodiments, the processing unit 110 does not have a direct connection to one or more memory dies such as memory die 120F in the illustrated embodiment. Therefore, the routing of memory request traffic using packets relies on one or more of the network switches 122A-122F and the interconnections between the memory dies 120A-120F.

In various embodiments, network switches 122A-122F are programmable. For example, each of the network switches 122A-122F uses a routing table which is updated by a set of commands in microcode, firmware or other software. In other embodiments, the routing table is updated by hardware through an interface and one or more configuration registers. The routing table provides a particular route through one or more of the multiple memory dies 120A-120F to the target memory array bank. In an embodiment, the programmable routing table is indexed with the target address of the memory request from the processing unit 110, and the routing table is used to select an output port of a corresponding one of the network switches 122A-122F. The output port is selected for routing the packet corresponding to the memory request based on at least a particular address range which includes the target address. As the memory dies 120A-120F are stacked vertically as in three dimensional (3D) integrated circuits (ICs), the particular route from the processing unit 110 to the target memory array bank uses vertical hops as well as horizontal hops.

In various embodiments, the on-die network switches 122A-122F, corresponding links and the vertical interconnects 136 are used to support the NoC communication subsystem. In some embodiments, although a single network switch is shown for each one of the memory dies 120A-120F, each of the memory dies 120A-120F uses multiple network switches. The one or more network switches are distributed across the die, one for one or more of the multiple memory array banks and at least one network switch for each TSB implementing the vertical interconnects 136.

In some embodiments, each of the distributed network switches uses five input ports and five output ports. One input port and one output port is used for the local node, such as control logic and storage logic used to implement one or more memory array banks. The other four input ports and four output ports are used for each of the x-direction and y-direction of a two-dimensional routing mesh. For a network switch at one of the vertical interconnections 136, a vertical port is also used for transferring traffic between dies connected in a stacked, vertical manner.

In various embodiments, each of the network switches 122A-122F uses control logic and routing tables for selecting one of the output ports for sending a received packet to another network switch. If the network switch is not connected to one of the vertical interconnections 136, then the packet is sent in one of the four available horizontal ports for making horizontal hops to other network switches across the memory die. If the network switch is connected to one of the vertical interconnections 136, then the packet is possibly sent on the port for making a vertical hop to a next network switch on another memory die.

In some embodiments, the network switches use arbitration control logic for determining an order for servicing received packets and for selecting which output port to use for each packet. In an embodiment, one or more of the network switches monitor congestion and failures on links and TSVs and communicate the status to one or more other network switches. In other embodiments, other control units monitor and measure the congestion and failure statuses of the communication resources such as the links and TSVs, and following, send communication indicating the statuses to one or more of the network switches.

Figure 2:
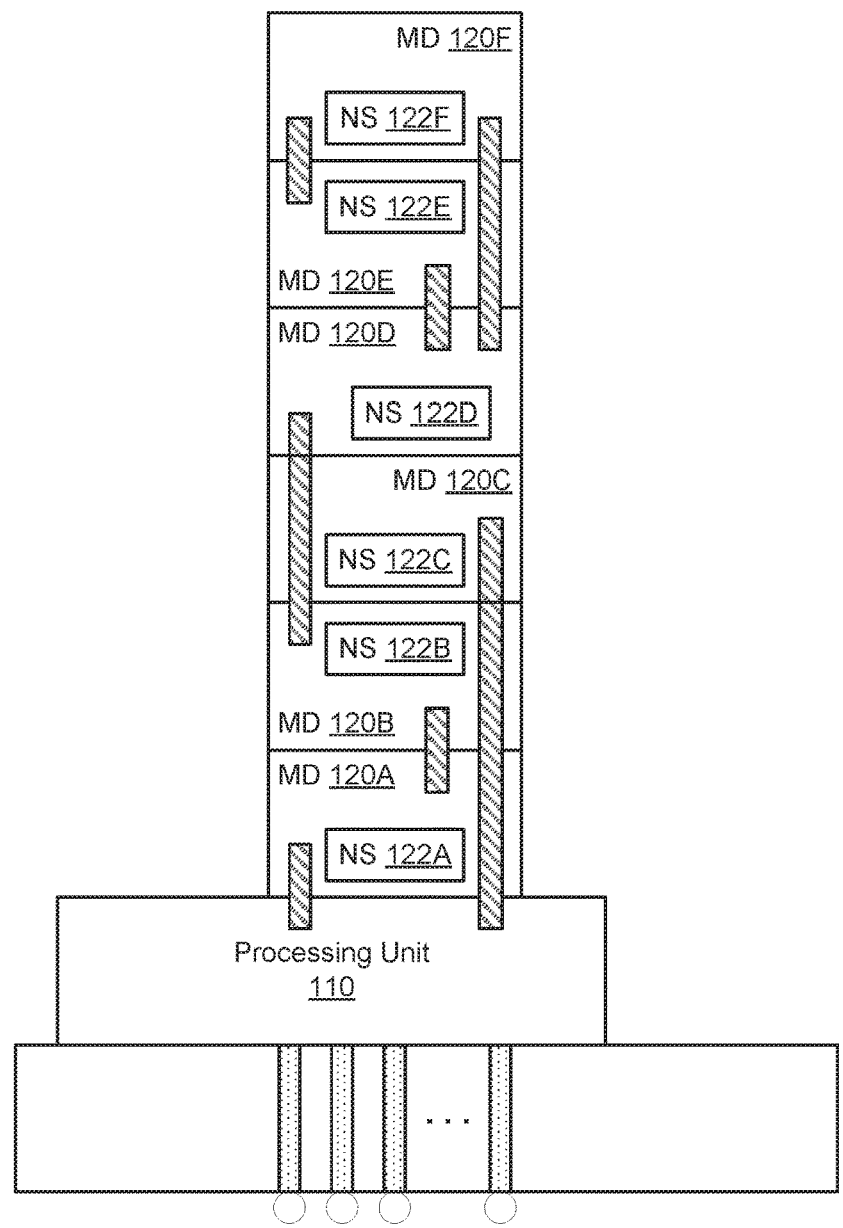
FIG. 2 is a block diagram of another embodiment of a system-in-package.

Referring to FIG. 2, a generalized block diagram of another embodiment of a system-in-package (SiP) 200 is shown. Circuitry and logic described earlier are numbered identically. In the illustrated embodiment, SiP 200 includes the memory dies 120A-120F stacked vertically and directly on top of the processing unit 110. The vertical interconnects 136 are used to provide communication between the processing unit 110 and the vertically stacked memory dies 120A-120F.

As described earlier, in some embodiments, some of the vertical interconnects 136 do not traverse through each of the multiple memory dies 120A-120F. Therefore, in some embodiments, the processing unit 110 does not have a direct connection to one or more memory dies such as memory dies 120D-120F shown in the illustrated embodiment. Rather, the routing of memory request traffic using packets relies on the programmable network switches 122A-122F and the interconnections located between the memory dies 120A-120F.

In some embodiments, the route selected by one or more of the network switches 122A-122F is determined based on detecting one or more of a congested link, a failed link, a failed memory array bank and a failed through silicon via. In an embodiment, the selected route includes one or more upward vertical hops and at least one subsequent downward vertical hop to avoid a congested or failed resource in the available interconnections.

Figure 3:
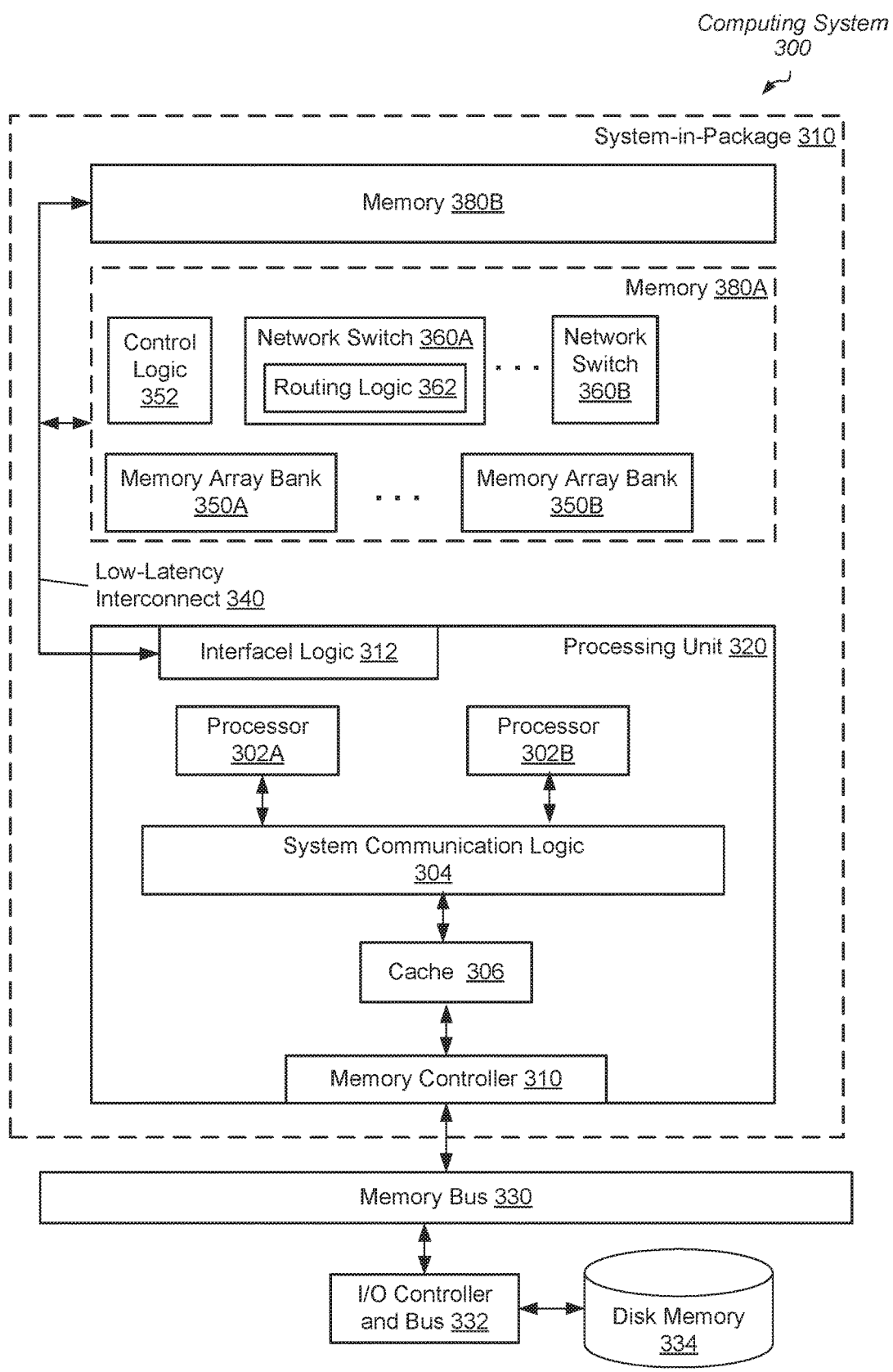
FIG. 3 is a block diagram of one embodiment of a computing system.

Turning now to FIG. 3, a generalized block diagram of one embodiment of a computing system 300 is shown. The computing system 300 utilizes three-dimensional (3D) packaging, such as a System in Package (SiP) as described earlier. As shown, processing unit 320 uses processors 302A-302B, interface logic 312, a memory controller 310, system communication logic 304, and a shared cache memory subsystem 306. In some embodiments, each of the processors 302A-302B is connected to one or more cache memory subsystems (not shown). In one embodiment, the illustrated functionality of the processing unit 320 is incorporated upon a single integrated circuit. The processing unit 320 is connected to the vertically stacked memory dies 380A-380B through low-latency interconnect 340. The in-package low-latency interconnect 340 is vertical with shorter lengths than long off-chip interconnects when a SiP is not used. Additionally, in the illustrated embodiment, the SiP 310 is connected to any off-chip DRAM (not shown) and the disk memory 334 through the memory bus 330 and the input/output (I/O) controller and bus 332.

In one embodiment, the computing system 300 is a stand-alone system within a mobile computer, a smart phone, or a tablet; a desktop; a server; or other. In one embodiment, system communication logic 304 is a system bus. In another embodiment, the processing unit 320 incorporates a system bus controller in logic 304 that utilizes one of various protocols to connect the processor cores 302A-302B to disk memory 334, DRAM (not shown) to be used in addition to the memory dies 380A-380B, peripheral input/output (I/O) devices, other processing units such as another general-purpose microprocessor, which may also be referred to as a central processing unit (CPU); a graphics processing unit (GPU), an accelerated processing unit (APU), a field programmable gate array (FPGA), a display controller, an analog-to-digital converter (ADC) or other. In such an embodiment, system communication logic 304 may replace or incorporate the functionality of memory controller 310 and interface logic 312.

In some embodiments, each of the processors 302A-302B uses circuitry for executing instructions according to a given instruction set such as the x86 instruction set architecture (ISA), the Alpha, PowerPC, or any other instruction set architecture. In various embodiments, each of the processors 302A-302B uses one or more processor cores with a superscalar, multi-threaded microarchitecture used for processing instructions of a given ISA. Although two processors are shown in the illustrated embodiment, the processing unit 320 uses any number of processors in other embodiments. In addition, in an embodiment, one or more of the processors in the processing unit 320 uses a relatively high parallel data microarchitecture, such as a single instruction multiple data (SIMD) microarchitecture, rather than a general-purpose microarchitecture. For example, an accelerated processing unit (APU) uses both a general-purpose CPU integrated on a same die with a GPU, a FPGA, or other processing unit, thus improving data transfer rates between these units while reducing power consumption. In other embodiments, an APU may include video processing and other application-specific accelerators.

In an embodiment, each of the processors 302A-302B uses on-chip memory storage, such as one or more levels of a hierarchical cache memory subsystem, used to reduce interconnect latencies. In addition, the processing unit 320 uses the shared cache memory subsystem 306 as a last-level cache (LLC) before accessing the vertically stacked memory dies 380A-380B, any off-chip DRAM, and the off-chip disk memory 334.

In an embodiment, the off-chip disk memory 334 uses a non-volatile, random access secondary storage of data. In one embodiment, the off-chip disk memory 334 may include one or more hard disk drives (HDDs). In another embodiment, the off-chip disk memory 334 utilizes a Solid-State Disk (SSD) comprising banks of Flash memory. The I/O controller and bus 332 supports communication protocols with the off-chip disk memory 334.

The processors 302A-302B access the various hierarchical levels of memory storage provided by at least the on-die caches, the cache 306 and the vertically stacked memory dies 380A-380B for data and instructions. As used herein, the term "access" regarding a cache memory subsystem refers to performing a read or a write request operation that may result in a cache hit if the requested data of a corresponding request address resides in the cache. Alternatively, the read or write operation may result in a cache miss if the requested data does not reside in the cache.

As used herein, a "block" is a set of bytes stored in contiguous memory locations, which are treated as a unit for cache coherency purposes. As used herein, each of the terms "cache block", "block", "cache line", and "line" is interchangeable. In some embodiments, a block may also be the unit of allocation and deallocation in a cache. The number of bytes in a block may be varied according to design choice, and may be of any size. In addition, each of the terms "cache tag", "cache line tag", and "cache block tag" is interchangeable.

If a cache miss occurs within the processing unit 320, then a read request is generated and transmitted to the memory controller 312 prior to any request being sent to off-chip memory through the memory controller 310. The interface 312 translates a target address corresponding to the requested block and sends a read request to the vertically stacked memory dies 380A-380B in a packet. In various embodiments, protocols, address formats, interface signals and synchronous/asynchronous clock domain usage, and so forth, in the interface 312 supports any one of a variety of memory communication protocols. For example, in an embodiment, one of a variety of network on chip (NoC) communication protocols is selected for support in the interface 312.

In various embodiments, each of the memory dies 380A-380B uses multiple memory array banks 350A-350B. Each of the memory array banks 350A-350B utilizes DRAM memory technology or other memory technologies such as magnetic tunnel junction (MTJ) memories, phase-change memories, spin-torque-transfer resistive memories, memristors, and so forth. In various embodiments, the relatively large on-package 3D memory dies 380A-380B reduces a number of off-package memory accesses and hides long memory latencies. In an embodiment, the computing system 300 still uses off-package DRAM (not shown).

In some embodiments, one or more of the memory array banks 350A-350B in the memory dies 380A-380B are used as a last level cache (LLC) while other memory array banks are used for system memory. The destination or target address in the generated memory access request is used to route the packet corresponding to the memory request through the memory dies 380A-380B to the target memory array bank. The network switches 360A-360B are used to route the packets between the processing unit 320 and the memory dies 380A-380B.

In an embodiment, the control logic 352 uses arbitration control logic for determining an order for servicing received packets. Although the control logic 352 is shown outside the network switch 360, in other embodiments, the arbitration logic is used within the network switch 360. The selected packets are provided to the routing logic 362 of the network switch 360. If the memory array banks 350A-350B do not include the target bank array for the received packet, then the routing logic 362 selects an output port of multiple output ports for routing the packet to another one of the vertically stacked memory dies 380A-380B. In some embodiments, the routing logic 362 determines one or more horizontal hops to a network switch with a connection to a vertical interconnect are used first. Afterward, the vertical hop occurs to another one of the memory dies 380A-380B.

Figure 4:
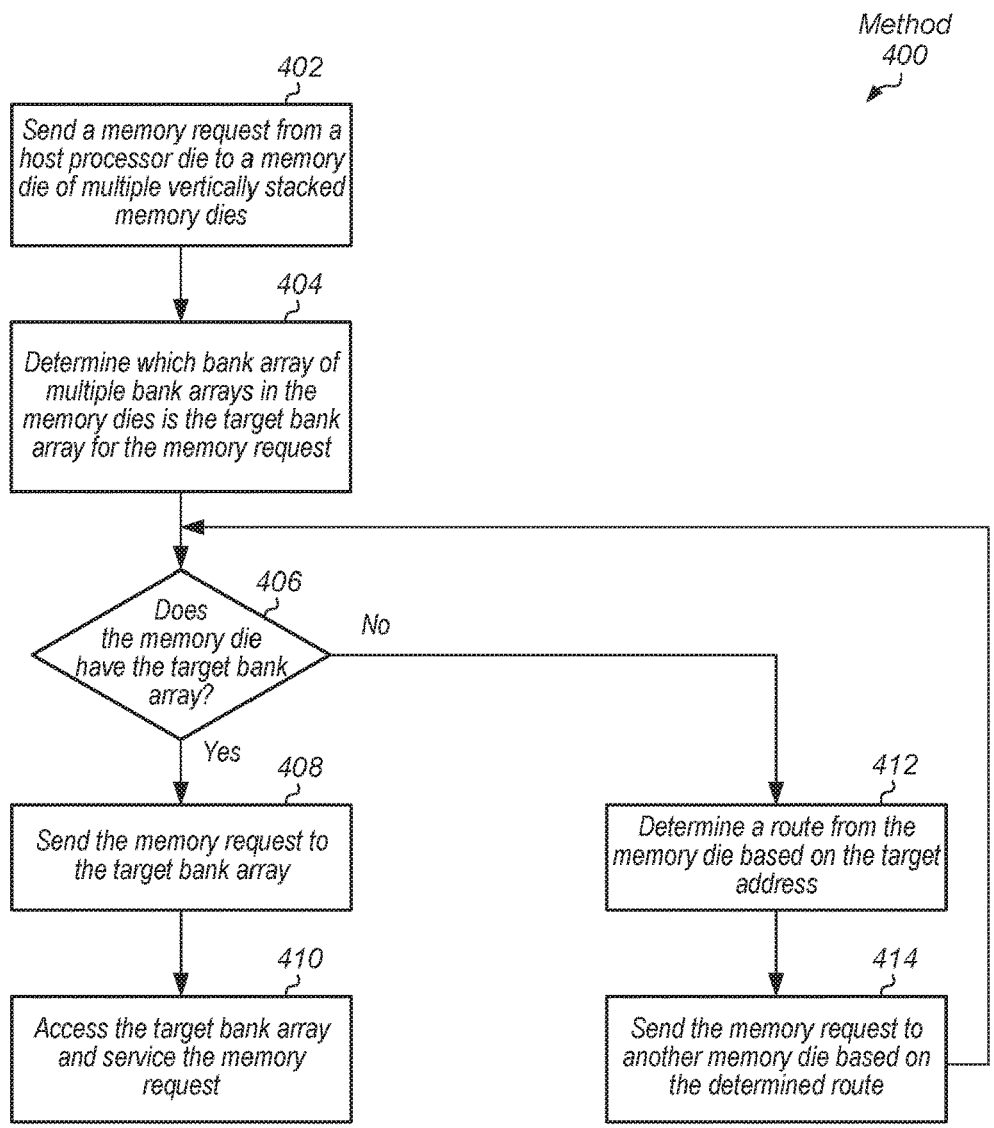
FIG. 4 is a flow diagram illustrating one embodiment of a method for routing traffic through vertically stacked memory.

Referring now to FIG. 4, one embodiment of a method 400 for processing a memory request in a memory module with hybrid interfaces is shown. For purposes of discussion, the steps in this embodiment (as well as in FIG. 5) are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 400.

In some embodiments, a processor within a processing unit of a system in a chip (SiP) generates memory requests to be serviced by vertically stacked memory dies. The processing unit die is referred to as the host processor. In some embodiments, the host processor is connected to one or more vertical stacks of memory dies through a horizontal connection using a silicon interposer. In other embodiments, a vertical stack of memory dies is placed on top of the host processor. A packet corresponding to a generated memory request is sent from the host processor die to a memory die of multiple vertically stacked memory dies (block 402). Which memory array bank of multiple memory array banks in the memory dies is determined to be the target memory array bank for the memory request based on the target (destination) address (block 404). If the memory die has the target memory array bank ("yes" leg of the conditional block 406), then the memory request is sent to the target memory array bank (block 408). Following, the target memory array bank is accessed and the memory request is serviced (block 410).

If the memory die does not have the target memory array bank ("no" leg of the conditional block 406), then a route is determined from the memory die based on the target address (block 412). For example, arbitration and routing logic is used to send the packet corresponding to the memory request to one of multiple output ports of a network switch. In some embodiments, the target address of the memory request is used to index one or more routing tables which store address ranges and corresponding output ports to use. It is determined which address range includes the target address, and thus, which table entry stores an indication of the output port of the network switch to use for further routing. In some embodiments, multiple output ports are made available based on updated indications indicating congestion and/or failure status of interconnections. Any one of a variety of congestion-based schemes is used. The memory request is sent to another memory die based on the determined route (block 414). Afterward, control flow of method 400 returns to conditional block 406 to determine whether the next memory die has the target memory array bank.

Figure 5:
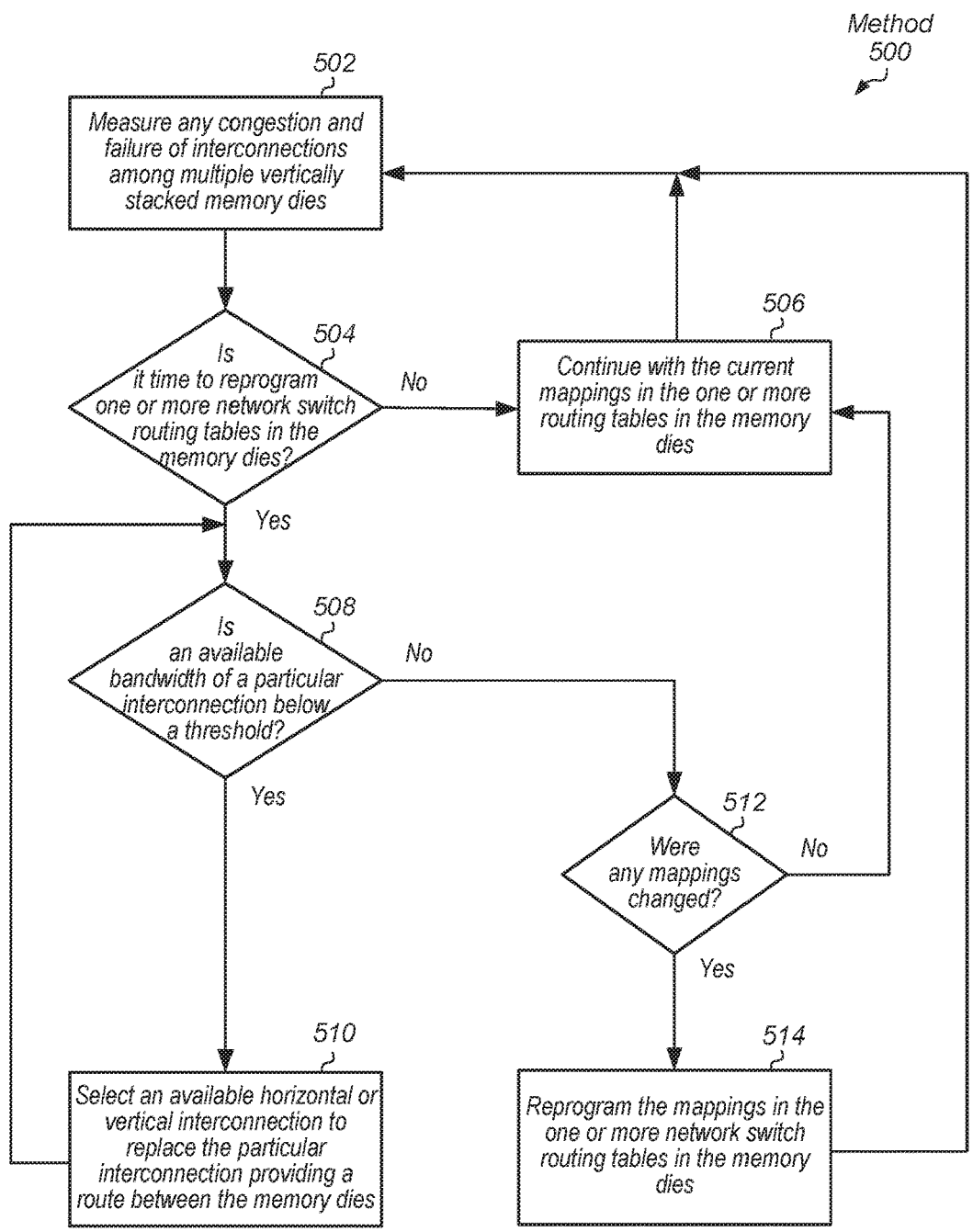
FIG. 5 is a flow diagram illustrating another embodiment of a method for configuring routing decisions distributed across vertically stacked memory.

Referring now to FIG. 5, one embodiment of a method 500 for configuring routing decisions distributed across vertically stacked memory is shown. Any congestion and failure of interconnections is measured among multiple vertically stacked memory dies (block 502). Any one of a variety of congestion-based schemes is used. In some embodiments, the measurement and update communication is distributed across multiple network switches and multiple vertically stacked memory dies. In other embodiments, the measurement and update communication is limited to one or more selected serialization points. The measured communication resources include one or more of at least communication links, vertical through silicon vias (and buses), memory array banks, and so forth.

In some embodiments, the updates of the congestion measurements is done dynamically as updates occur. In other embodiments, thresholds of the congestion measurements are used to determine when to perform updates across multiple network switches. In yet other embodiments, an elapsed time duration is used alone or in combination with the other thresholds to determine whether it is time to reconfigure the routing and control logic in multiple network switches. If it is not yet time to reprogram one or more network switch routing tables in the memory dies ("no" leg of the conditional block 504), then the routing of traffic continues with the current mappings in the one or more network switch routing tables in the memory dies (block 506). Control flow of method 500 returns to block 502 where any congestion and failure of interconnections is measured among multiple vertically stacked memory dies.

If it is time to reprogram one or more network switch routing tables in the memory dies ("yes" leg of the conditional block 504), and an available bandwidth of a particular interconnection is below a threshold ("yes" leg of the conditional block 508), then an available horizontal or vertical interconnection is selected to replace the particular interconnection providing a route between the memory dies (block 510). Afterward, control flow of method 500 returns to the conditional block 508 where a check is performed to determine whether an available bandwidth of a particular interconnection is below a threshold.

If it is time to reprogram one or more network switch routing tables in the memory dies ("yes" leg of the conditional block 504), and no interconnection has an available bandwidth below a threshold ("no" leg of the conditional block 508), and no mappings were changed ("no" leg of the conditional block 512), then control flow of method 500 returns to block 506. At block 506, the routing of traffic continues with the current mappings. If any mappings were changed ("yes" leg of the conditional block 512), then the mappings in the one or more network switch routing tables in the memory dies are reprogrammed (block 514). Afterward, control flow of method 500 returns to 502 where any congestion and failure of interconnections is measured among multiple vertically stacked memory dies.

In various embodiments, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors configured to execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A system in package, comprising:
a host processor die configured to generate memory requests; and
a plurality of memory dies stacked vertically, each memory die comprising:
a plurality of memory array banks; and
a network switch for routing memory requests to another one of the plurality of memory dies;
wherein a first memory die of the plurality of memory dies is configured to:
receive a memory request from the host processor die;
determine if a first memory array bank within the plurality of memory dies is a target memory array bank for the memory request based on a target address of the memory request;
determine, by a network switch of the first memory die, a first route to the first memory array bank within the plurality of memory dies; and
send the memory request to the first memory array bank via the first route.

2. The system as recited in claim 1, wherein the plurality of memory dies comprises a plurality of through silicon via interconnects, wherein at least one through silicon via does not traverse through each of the plurality of memory dies.

3. The system as recited in claim 2, wherein the host processor die does not have a direct connection to one or more of the plurality of memory dies.

4. The system as recited in claim 1, wherein the first route includes one or more upward vertical hops and at least one subsequent downward vertical hop through the plurality of dies.

5. The system as recited in claim 4, wherein the one or more upward vertical hops and at least one subsequent downward vertical hop avoids one or more of a congested link, a failed link, a failed memory array bank, and a failed through silicon via within the plurality of memory dies.

6. The system as recited in claim 1, wherein a second memory die of the plurality of memory dies is configured to:
receive the memory request after the memory request left the first memory die;
determine a second route through the plurality of memory dies to the first memory array bank; and
send the memory request to the first memory array bank via the second route.

7. The system as recited in claim 1, wherein determining the first route within the plurality of memory dies comprises:
performing a lookup, with the target address, of a table within the network switch, wherein the table comprises a plurality of address ranges;
determining if a first address range includes the target address; and selecting an output port of the network switch for routing the memory request to one of the plurality of memory dies based on the first address range.

8. The system as recited in claim 1, wherein each of the network switches in the plurality of memory dies comprises a programmable routing table for determining a route through the plurality of memory dies to a targeted memory array bank for a received memory request, wherein the programmable routing table is updated based on one or more of a congested link, a failed link, a failed memory array bank and a failed through silicon via.

9. A method, comprising:
generating memory requests by a host processor;
receiving a memory request from the host processor by a first memory die of a plurality of memory dies stacked vertically, each memory die comprising:
 a plurality of memory array banks; and
 a network switch for routing memory requests to another one of the plurality of memory dies; and
determining if a first memory array bank within the plurality of memory dies is a target memory array bank for the memory request based on a target address of the memory request;
determining, by a network switch of the first memory die, a first route to the first memory array bank within the plurality of memory dies; and
sending the memory request to the first memory array bank via the first route.

10. The method as recited in claim 9, wherein the plurality of memory dies comprises a plurality of through silicon via interconnects, wherein at least one through silicon via does not traverse through each of the plurality of memory dies.

11. The method as recited in claim 9, wherein the first route includes one or more upward vertical hops and at least one subsequent downward vertical hop through the plurality of dies.

12. The method as recited in claim 11, wherein the one or more upward vertical hops and at least one subsequent downward vertical hop avoids one or more of a congested link, a failed link and a failed memory array bank within the plurality of memory dies.

13. The method as recited in claim 9, further comprising:
receiving the memory request at a second memory die after the memory request left the first memory die;
determining a second route different from the first route through the plurality of memory dies to the first memory array bank; and
sending the memory request to the first memory array bank via the second route.

14. The method as recited in claim 9, wherein determining the first route within the plurality of memory dies comprises:
performing, with the target address, a lookup of a table of within the network switch, wherein the table comprises a plurality of address ranges
determining if a first address range includes the target address; and
selecting an output port of the network switch for routing the memory request to one of the plurality of memory dies based on the first address range.

15. The method as recited in claim 9, wherein each of the network switches in the plurality of memory dies comprises a programmable routing table for determining a route through the plurality of memory dies to a targeted memory array bank for a received memory request, wherein the programmable routing table is updated based on one or more of a congested link, a failed link, a failed memory array bank and a failed through silicon via.

16. The method as recited in claim 15, wherein the programmable routing table is changed based on detecting one or more of a congested link, a failed link, a failed memory array bank and a failed through silicon via within the plurality of memory dies.

17. A network switch on a memory die, comprising:
an interface for receiving memory requests generated by a host processor; and
control logic configured to:
route memory requests to another one of a plurality of memory dies;
determine if a first memory array bank within the plurality of memory dies is a target memory array bank for a received memory request based on a target address of the memory request, wherein each memory die of the plurality of memory dies comprises:
 a plurality of memory array banks; and
 a network switch for routing memory requests to another one of the plurality of memory dies; and
determine a first route through the plurality of memory dies to the first memory array bank within the plurality of memory dies; and
send the memory request to the first memory array bank via the first route.

18. The network switch on the memory die as recited in claim 17, wherein the first route includes one or more upward vertical hops and at least one subsequent downward vertical hop through the plurality of dies.

19. The network switch on the memory die as recited in claim 17, wherein determining the first route within the plurality of memory dies comprises:
performing, with the target address, a lookup of a table within the network switch, wherein the table comprises a plurality of address ranges;
determining if a first address range includes the target address; and
selecting an output port of the network switch for routing the memory request to one of the plurality of memory dies based on the first address range.

20. The network switch on the memory die as recited in claim 17, wherein the control logic uses a programmable routing table for determining a route through the plurality of memory dies to a targeted memory array bank for a received memory request, wherein the programmable routing table is updated based on one or more of a congested link, a failed link, a failed memory array bank and a failed through silicon via.

* * * * *

UNITED STATES PATENT AND TRADEMARK OFFICE
CERTIFICATE OF CORRECTION

PATENT NO. : 10,496,561 B2
APPLICATION NO. : 15/490036
DATED : December 3, 2019
INVENTOR(S) : Roberts et al.

Page 1 of 1

It is certified that error appears in the above-identified patent and that said Letters Patent is hereby corrected as shown below:

In the Claims

Column 11, Claim 14, Line 52, please delete "table of" and substitute -- table --.

Signed and Sealed this
Eighteenth Day of February, 2020

Andrei Iancu
*Director of the United States Patent and Trademark Office*